(12) United States Patent
Wicker

(10) Patent No.: US 6,881,608 B2
(45) Date of Patent: Apr. 19, 2005

(54) SEMICONDUCTOR PROCESSING EQUIPMENT HAVING IMPROVED PROCESS DRIFT CONTROL

(75) Inventor: Thomas E. Wicker, Reno, NV (US)

(73) Assignee: Lam Research Corporation, Fremont, CA (US)

( * ) Notice: Subject to any disclaimer, the term of this patent is extended or adjusted under 35 U.S.C. 154(b) by 0 days.

(21) Appl. No.: 10/700,853

(22) Filed: Nov. 5, 2003

(65) Prior Publication Data

US 2004/0092120 A1 May 13, 2004

Related U.S. Application Data

(62) Division of application No. 09/469,300, filed on Dec. 22, 1999, now Pat. No. 6,673,198.

(51) Int. Cl.[7] .......................... H01L 21/44; H01L 21/48; H01L 21/50
(52) U.S. Cl. ....................... 438/106; 438/115; 438/706; 438/707; 438/710; 438/719
(58) Field of Search ................................ 438/115, 106, 438/689, 706, 707, 710, 716, 719; 216/58, 59, 67, 74, 79

(56) References Cited

U.S. PATENT DOCUMENTS

| | | |
|---|---|---|
| 3,951,587 A | 4/1976 | Alliegro et al. |
| 3,962,391 A | 6/1976 | Dietze et al. |
| 4,093,201 A | 6/1978 | Dietze et al. |
| 4,203,940 A | 5/1980 | Dietze et al. |
| 4,340,462 A | 7/1982 | Koch |
| 4,401,689 A | 8/1983 | Ban |
| 4,491,496 A | 1/1985 | Laporte et al. |
| 4,518,349 A | 5/1985 | Tressler et al. |
| 4,761,134 A | 8/1988 | Foster |
| 4,869,929 A | 9/1989 | Cabrera et al. |
| 4,948,458 A | 8/1990 | Ogle |
| 4,978,567 A | 12/1990 | Miller |
| 4,987,016 A | 1/1991 | Ohto et al. |
| 4,999,228 A | 3/1991 | Matsumoto et al. |
| 5,006,220 A | 4/1991 | Hijikata et al. |
| 5,022,979 A | 6/1991 | Hijikata et al. |
| 5,074,456 A | 12/1991 | Degner et al. |
| 5,085,727 A | 2/1992 | Steger |
| 5,182,059 A | 1/1993 | Kawasaki et al. |
| 5,200,232 A | 4/1993 | Tappan et al. |
| 5,252,892 A | 10/1993 | Koshiishi et al. |
| 5,262,029 A | 11/1993 | Erskine et al. |
| 5,283,089 A | 2/1994 | Bates |

(Continued)

FOREIGN PATENT DOCUMENTS

| | | |
|---|---|---|
| EP | 0284885 A | 10/1988 |
| EP | 0693865 A | 1/1996 |
| EP | 0 821397 A2 | 1/1998 |
| EP | 0 826646 A1 | 3/1998 |
| JP | 60-200519 | 10/1985 |

(Continued)

*Primary Examiner*—Amir Zarabian
*Assistant Examiner*—Thanh Y. Tran
(74) *Attorney, Agent, or Firm*—Burns, Doane, Swecker & Mathis, LLP

(57) ABSTRACT

A plasma processing chamber including a slip cast part having a surface thereof exposed to the interior space of the chamber. The slip cast part includes free silicon contained therein and a protective layer on the surface which protects the silicon from being attacked by plasma in the interior space of the chamber. The slip cast part can be made of slip cast silicon carbide coated with CVD silicon carbide. The slip cast part can comprise one or more parts of the chamber such as a wafer passage insert, a monolithic or tiled liner, a plasma screen, a showerhead, dielectric member, or the like. The slip cast part reduces particle contamination and reduces process drift in plasma processes such as plasma etching of dielectric materials such as silicon oxide.

9 Claims, 6 Drawing Sheets

U.S. PATENT DOCUMENTS

| | | | |
|---|---|---|---|
| 5,292,399 | A | 3/1994 | Lee et al. |
| 5,366,585 | A | 11/1994 | Robertson et al. |
| 5,460,684 | A | 10/1995 | Saeki et al. |
| 5,463,525 | A | 10/1995 | Barnes et al. |
| 5,494,523 | A * | 2/1996 | Steger et al. ............ 118/723 E |
| 5,538,230 | A | 7/1996 | Sibley |
| 5,556,501 | A | 9/1996 | Collins et al. |
| 5,569,356 | A | 10/1996 | Lenz et al. |
| 5,578,129 | A | 11/1996 | Moriya |
| 5,595,627 | A | 1/1997 | Inazawa et al. |
| 5,641,375 | A | 6/1997 | Nitescu et al. |
| 5,680,013 | A | 10/1997 | Dornfest et al. |
| 5,788,799 | A | 8/1998 | Steger et al. |
| 5,792,304 | A * | 8/1998 | Tamura et al. ......... 156/345.27 |
| 5,798,016 | A | 8/1998 | Oehrlein et al. |
| 5,820,723 | A | 10/1998 | Benjamin et al. |
| 5,838,529 | A | 11/1998 | Shufflebotham et al. |
| 5,863,376 | A | 1/1999 | Wicker et al. |
| 5,885,356 | A | 3/1999 | Zhao et al. |
| 5,888,907 | A | 3/1999 | Tomoyasu et al. |
| 5,892,236 | A | 4/1999 | Takahashi et al. |
| 5,904,778 | A | 5/1999 | Lu et al. |
| 6,048,798 | A * | 4/2000 | Gadgil et al. ................ 438/714 |
| 6,073,577 | A | 6/2000 | Lilleland et al. |
| 6,129,808 | A * | 10/2000 | Wicker et al. ........... 156/345.1 |
| 6,227,140 | B1 | 5/2001 | Kennedy et al. |
| 6,251,793 | B1 * | 6/2001 | Wicker et al. .............. 438/710 |
| 6,358,565 | B1 | 3/2002 | Krenkel et al. |
| 6,583,064 | B1 * | 6/2003 | Wicker et al. .............. 438/710 |

FOREIGN PATENT DOCUMENTS

| | | |
|---|---|---|
| JP | 63-35452 | 2/1988 |
| JP | 63-138737 | 8/1988 |
| JP | 63-186874 | 8/1988 |
| JP | 3-201322 | 9/1991 |
| JP | 5-090184 | 9/1993 |
| JP | 8-17745 | 1/1996 |
| JP | 63-273323 | 11/1998 |
| WO | 99/50886 | 10/1999 |

* cited by examiner

SEMICONDUCTOR PROCESSING EQUIPMENT HAVING IMPROVED PROCESS DRIFT CONTROL

This application is a divisional of application Ser. No. 09/469,300, filed on Dec. 22, 1999 now U.S. Pat. No. 6,673,198, which is incorporated herein by reference.

FIELD OF THE INVENTION

The invention relates to semiconductor processing equipment and more particularly to improved process drift control during processing such as plasma etching of semiconductor substrates.

BACKGROUND OF THE INVENTION

In the field of semiconductor processing, vacuum processing chambers are generally used for etching and chemical vapor deposition (CVD) of materials on substrates by supplying an etching or deposition gas to the vacuum chamber and application of an RF field to the gas to energize the gas into a plasma state. Examples of parallel plate, transformer coupled plasma (TCP™) which is also called inductively coupled plasma (ICP), and electron-cyclotron resonance (ECR) reactors and components thereof are disclosed in commonly owned U.S. Pat. Nos. 4,340,462; 4,948,458; 5,200,232 and 5,820,723. Because of the corrosive nature of the plasma environment in such reactors and the requirement for minimizing particle and/or heavy metal contamination, it is highly desirable for the components of such equipment to exhibit high corrosion resistance.

During processing of semiconductor substrates, the substrates are typically held in place within the vacuum chamber on substrate holders by mechanical clamps and electrostatic clamps (ESC). Examples of such clamping systems and components thereof can be found in commonly owned U.S. Pat. Nos. 5,262,029 and 5,838,529. Process gas can be supplied to the chamber in various ways such as by gas nozzles, gas rings, gas distribution plates, etc. An example of a temperature controlled gas distribution plate for an inductively coupled plasma reactor and components thereof can be found in commonly owned U.S. Pat. No. 5,863,376.

Aluminum and aluminum alloys are commonly used for walls of plasma reactors. In order to prevent corrosion of the walls, various techniques have been proposed for coating the aluminum surface with various coatings. For instance, U.S. Pat. No. 5,641,375 discloses that aluminum chamber walls have been anodized to reduce plasma erosion and wear of the walls. The '375 patent states that eventually the anodized layer is sputtered or etched off and the chamber must be replaced. U.S. Pat. No. 5,680,013 states that a technique for flame spraying $Al_2O_3$ on metal surfaces of an etching chamber is disclosed in U.S. Pat. No. 4,491,496. The '013 patent states that the differences in thermal expansion coefficients between aluminum and ceramic coatings such as aluminum oxide leads to cracking of the coatings due to thermal cycling and eventual failure of the coatings in corrosive environments. U.S. Pat. No. 5,085,727 discloses a carbon coating for walls of a plasma chamber wherein the coating is deposited by plasma assisted CVD.

In order to protect the chamber walls, U.S. Pat. Nos. 5,366,585; 5,556,501; 5,788,799; 5,798,016; and 5,885,356 propose liner arrangements. For instance, the '585 patent discloses a free standing ceramic liner having a thickness of at least 0.005 inches and machined from solid alumina. The '585 patent also mentions use of ceramic layers which are deposited without consuming the underlying aluminum can be provided by flame sprayed or plasma sprayed aluminum oxide. The '501 patent discloses a process-compatible liner of polymer or quartz or ceramic. The '799 patent discloses a temperature controlled ceramic liner having a resistance heater embedded therein and the ceramic can be alumina, silica, titania, zirconia, silicon carbide, titanium carbide, zirconium carbide, aluminum nitride, boron nitride, silicon nitride and titanium nitride. The '016 patent discloses a liner of ceramics, aluminum, steel and/or quartz with aluminum being preferred for its ease of machinability and having a coating of aluminum oxide, $Sc_2O_3$ or $Y_2O_3$, with $Al_2O_3$ being preferred for coating aluminum to provide protection of the aluminum from plasma. The '356 patent discloses a ceramic liner of alumina and a ceramic shield of aluminum nitride for the wafer pedestal for use in CVD chambers.

U.S. Pat. No. 5,904,778 discloses a SiC CVD coating on free standing SiC for use as a chamber wall, chamber roof, or collar around the wafer. U.S. Pat. No. 5,292,399 discloses a SiC ring surrounding a wafer pedestal. A technique for preparing sintered SiC is disclosed in U.S. Pat. No. 5,182,059.

In addition to the above, the use of silicon carbide in semiconductor processing equipment is disclosed in U.S. Pat. Nos. 4,401,689 (susceptor tube), 4,518,349 (furnace support rod), 4,999,228 (diffusion tube), 5,074,456 (upper electrode), 5,252,892 (plasma cathode chamber), 5,460,684 (resistive layer of ESC), 5,463,525 (sensing pin), 5,578,129 (filter plate of load lock system), 5,538,230 (wafer boat), 5,595,627 (upper electrode), 5,888,907 (electrode plate), and 5,892,236 (ion implantation device).

Other documents include Japanese Patent Publication Nos. 60-200519 (susceptor), 63-35452 (diffusion oven tube, liner tube, port element, paddle), 63-186874 (microwave heated sample plate), 63-138737 (upper electrode of plasma etch reactor), 3-201322 (coating for part in vacuum environment), and 8-17745 (wafer heater). Of these, Japanese Patent Publication No. 63-35452 discloses parts made of slip cast silicon carbide.

With regard to plasma reactor components such as showerhead gas distribution systems, various proposals have been made with respect to the materials of the showerheads. For instance, commonly owned U.S. Pat. No. 5,569,356 discloses a showerhead of silicon, graphite, or silicon carbide. U.S. Pat. No. 5,888,907 discloses a showerhead electrode of amorphous carbon, SiC or Al. U.S. Pat. Nos. 5,006,220 and 5,022,979 disclose a showerhead electrode either made entirely of SiC or a base of carbon coated with SiC deposited by CVD to provide a surface layer of highly pure SiC.

In discussing the need for cleanliness and the elimination of contaminants in the processing of semiconductor wafers; U.S. Pat. No. 5,538,230 references U.S. Pat. Nos. 3,962,391; 4,093,201; 4,203,940; 4,761,134; 4,978,567; 4,987,016 and Japanese Publication No. 50-90184. The '230 patent also references U.S. Pat. Nos. 3,951,587 and 5,283,089 for discussions of SiC parts and references U.S. Pat. No. 4,761,134 for a discussion of CVD SiC on Si infiltrated SiC or porous Si that has not been filled with Si.

Japanese Publication No. 63-273323 discloses SiC parts for an ECR plasma deposition apparatus wherein silicon dioxide is deposited on samples, the SiC parts being coated with SiC by generating a plasma in the chamber and introducing methane and silane gases into the chamber.

In view of the need for high purity and corrosion resistance for components of semiconductor processing equipment, there is a need in the art for improvements in materials and/or coatings used for such components.

Moreover, with regard to the chamber materials, any materials which can increase the service life of a plasma reactor chamber and thus reduce the down time of the apparatus, would be beneficial in reducing the cost of processing the semiconductor wafers.

SUMMARY OF THE INVENTION

The invention provides a method of processing semiconductor substrates and reducing particle contamination and/or process drift during consecutive processing of the substrates. The method comprising steps of (a) placing a substrate on a substrate holder in an interior space of a plasma processing chamber, the processing chamber including at lease one slip cast part having a surface exposed to the interior space, the slip cast part having free silicon contained therein and a protective layer on the surface which protects the silicon from being attacked by the plasma in the interior space, (b) processing the substrate by supplying process gas to the processing chamber and energizing the process gas into a plasma state in the processing chamber, the slip cast part being exposed to the plasma and optionally providing a ground path for RF current sustaining the plasma, (c) removing the substrate from the processing chamber, and (d) consecutively processing additional substrates in the processing chamber by repeating steps (a–c) while minimizing particle contamination of the substrates and/or reducing process drift during the processing step as a result of protecting the free silicon from attack by the plasma.

According to one optional aspect of the method, the slip cast part can comprise a liner within a sidewall of the processing chamber and the processing chamber can include a substantially planar antenna which energizes the process gas into the plasma state by supplying RF power to the antenna. For plasma etching of oxide materials, the process gas can comprise one or more hydrofluorocarbon gases. For oxide etching, the plasma preferably comprises a high density plasma which etches an oxide layer on the substrates while an RF bias is applied to the substrates.

The slip cast part can comprise one or more parts of the chamber. For instance, the slip cast part can comprise a liner within a sidewall of the processing chamber, a gas distribution plate supplying the process gas to the processing chamber, a perforated baffle extending between the substrate holder and an inner wall of the processing chamber, a wafer passage insert, a focus ring surrounding the substrate, a tubular liner protecting a process monitoring device, or the like. In a preferred embodiment, the slip cast part is a wafer passage insert fitted in an opening in a ceramic liner within a sidewall of the processing chamber wherein the liner is heated by a heater which maintains the liner at a desired temperature. The slip cast part can consist essentially of silicon impregnated slip cast SiC coated with CVD SiC.

In an exemplary process, a first slip cast part comprises a heated liner and a second slip cast part comprises a plasma screen arranged such that the liner surrounds the substrate holder and the plasma screen extends between the liner and the substrate holder, the liner being heated to a temperature above room temperature during the processing step. In another process, the slip cast part comprises a gas distribution plate having a resistivity high enough to pass RF energy therethrough, the process gas being energized by an antenna which couples RF energy into the chamber through the gas distribution plate. A third slip cast part can comprise a chamber liner having a resistivity below 200 Ω·cm, preferably below 50 Ω·cm, and more preferably below 10 Ω·cm.

The invention also provides a plasma processing system useful for processing semiconductor substrates comprising a plasma processing chamber having an interior space bounded by a chamber sidewall, a substrate support on which a substrate is processed within the interior space arranged such that the chamber sidewall is spaced outwardly of a periphery of the substrate support, a gas supply through which process gas can be supplied to the interior space during processing of the substrate, an energy source which can energize the process gas in the interior space into a plasma state during processing of the substrate, and a slip cast part having a surface thereof exposed to the interior space, the slip cast part having free silicon contained therein and a protective layer on the surface which protects the silicon from being attacked by the plasma in the interior space. According to a preferred embodiment, the slip cast part is of porous silicon carbide backfilled with silicon and the protective layer is a chemical vapor deposited layer of silicon carbide. A preferred slip cast part is a wafer passage insert of a plasma etch reactor wherein the gas supply supplies a fluorocarbon and/or a fluorohydrocarbon to the interior space.

In a less preferred embodiment, the slip cast part is bonded to the chamber by an elastomer joint or the chamber can include a ceramic liner between the chamber sidewall and the substrate support wherein the slip cast part comprises a tubular liner in an opening extending through the liner. A preferred energy source is an antenna such as a planar coil which inductively couples radiofrequency energy through a dielectric member into the chamber.

According to a preferred embodiment, the interior of the chamber is bounded by a showerhead having a silicon carbide surface extending across the top of the chamber, a liner having a silicon carbide surface extending downwardly from the silicon carbide surface of the showerhead, a plasma screen having a silicon carbide surface extending inwardly from the silicon carbide surface of the liner, and the slip cast part comprises a wafer passage insert fitted in an opening in the liner, the CVD SiC coating forming a surface of the wafer passage insert through which a semiconductor wafer passes into and out of the chamber.

DETAILED DESCRIPTION OF THE PREFERRED EMBODIMENTS

Figure 1:
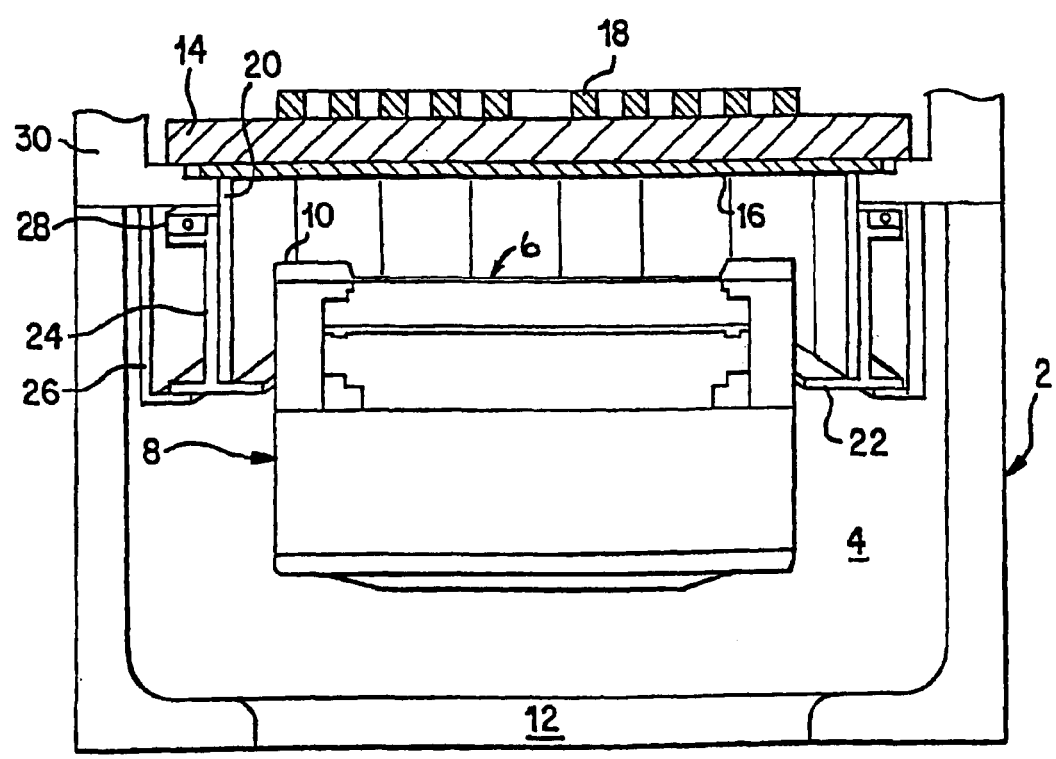
FIG. 1 shows a single wafer vacuum processing chamber having an inductively coupled plasma source and a tiled liner of slip cast parts in accordance with the invention.

According to the invention, a plasma processing chamber having improved process drift control is provided. The improved process drift control is achieved by use of one or more parts in the chamber of a part having a surface thereof exposed to the interior space, the part having free silicon contained therein and a protective layer on the surface which protects the silicon from being attacked by the plasma in the interior. The free silicon can be silicon impregnated into a porous SiC body, the silicon filling the porosity to minimize undesirable process effects and increase electrical conductivity which is useful for lowering the RF impedance of the part.

The part can have any desired configuration such as that of a wafer passage insert, a chamber wall, a substrate support, an electrode, a showerhead, etc. According to a preferred embodiment, the part comprises a slip cast silicon carbide part which has been backfilled or impregnated with silicon and the protective coating preferably comprises CVD silicon carbide.

The invention provides parts for a plasma chamber wherein the parts are made entirely of Si and SiC. Such materials are compatible in plasma environments since plasma erosion of Si or SiC produces gaseous Si or C compounds which can be pumped from the chamber without particle contamination of the substrate. With regard to thermal control, SiC has been found to exhibit exceptionally high thermal conductivity enabling parts of such material to be heated or cooled to a desired temperature range during processing of substrates such as silicon wafers.

Slip cast SiC parts in accordance with the invention can be made by the following process. In the process, a bimodal distribution of SiC powder is prepared. For example, a first SiC fraction having a mean particle size of 10 to 80 $\mu$m, preferably 25 to 50 $\mu$m is combined with a second fraction having a mean particle size of 80 to 200 $\mu$m, preferably 100 to 150 $\mu$m, the powder mixture is combined with water and organic agents such as a flocculent, and the mixture is poured into a mold to form a slip cast part. After drying such as at room temperature, the slip cast part is green machined and sintered at a suitable temperature such as around 1500 to 2000° C., the sintered part is purified in an acid bath, the cleaned part is subjected to impregnation with silicon to fill the porosity (e.g., 15 to 20%) of the part such as by melting powdered silicon and wicking the melted silicon through porous graphite and into the part fill essentially 100% of the porosity in the part, cooling the part followed by removing any excess silicon exuded out of the part, and machining the part to final tolerances such as by diamond grinding. The surface of the part can be sealed with a CVD SiC coating of any suitable thickness such as 50 to 500 $\mu$m, preferably around 200 $\mu$m for parts not directly exposed to the plasma or the coating can be in excess of 1 mm, preferably 2 mm or more for parts exposed directly to the plasma.

The slip cast part can be used in any plasma reaction chamber wherein it is desired to reduce particle contamination and/or reduce process drift. An example of a single wafer vacuum processing chamber 2 having an inductively coupled plasma source is shown in FIG. 1 wherein processing gas is supplied to the processing chamber 2 by suitable apparatus (not shown) such as gas distribution rings, gas distribution plate, injection nozzles, etc., and a vacuum is maintained in the interior 4 of the chamber by suitable vacuum pump apparatus. The substrate to be processed in the chamber can comprise a silicon semiconductor wafer 6 supported on a substrate support 8. The substrate support 8 can include an electrostatic chuck and a focus ring 10. The vacuum pump can be connected to a large outlet port 12 in an endwall such as the bottom of process chamber. The vacuum processing chamber can include a dielectric window 14, a gas distribution plate 16 and RF power can be supplied to the chamber through an external RF antenna such as a planar coil 18 outside the dielectric window 14 on an endwall such as the top of the chamber. However, the plasma generating source can be of any other type of plasma generating equipment such as that of an ECR reactor, a capacitively coupled parallel plate reactor, a surface wave reactor, a magnetron reactor, helicon reactor, helical resonator, etc. The plasma generating source can be attached to a modular mounting arrangement such as an annular mounting flange which is removably mounted on the endwall of the chamber.

In order to maintain a vacuum tight seal between the mounting flange and the chamber 2, suitable O-ring seals can be fitted within grooves in the endwall of the chamber 2 and RF shielding members can surround the vacuum seals. If a large vacuum force is provided by the vacuum pump, it is not necessary to utilize fasteners for attaching the mounting flange to the chamber 2. Instead, the mounting flange can simply rest on the endwall of the chamber 2. If desired, the mounting flange or another part of the plasma generating source assembly can be hinged to the chamber 2 such that the plasma generating source can be pivoted to an orientation such as a vertical orientation for servicing the interior 4 of the chamber 2.

The chamber includes a liner 20, a plasma screen 22 for confining the plasma in the space surrounding the wafer 6 extends inwardly from the lower end of the liner 20 and a wafer passage insert 21. The liner 20 can be supported in any suitable way such as by an elastically bendable frame in the case of a solid cylindrical liner which includes an inner support frame 24 and an outer support frame 26. In order to maintain the liner at a desired temperature during processing of a substrate, a heater 28 can be provided on the top of the inner frame support 24. In operation, the heater 28 is effective to heat the liner 20 and removal of heat from the liner 20 can be accomplished by a temperature controlled member 30 which withdraws heat from the liner through the inner and outer frames. Other types of heating arrangements such as a heater embedded in the liner or suitable radiant heating arrangements can also be used.

Figure 2:
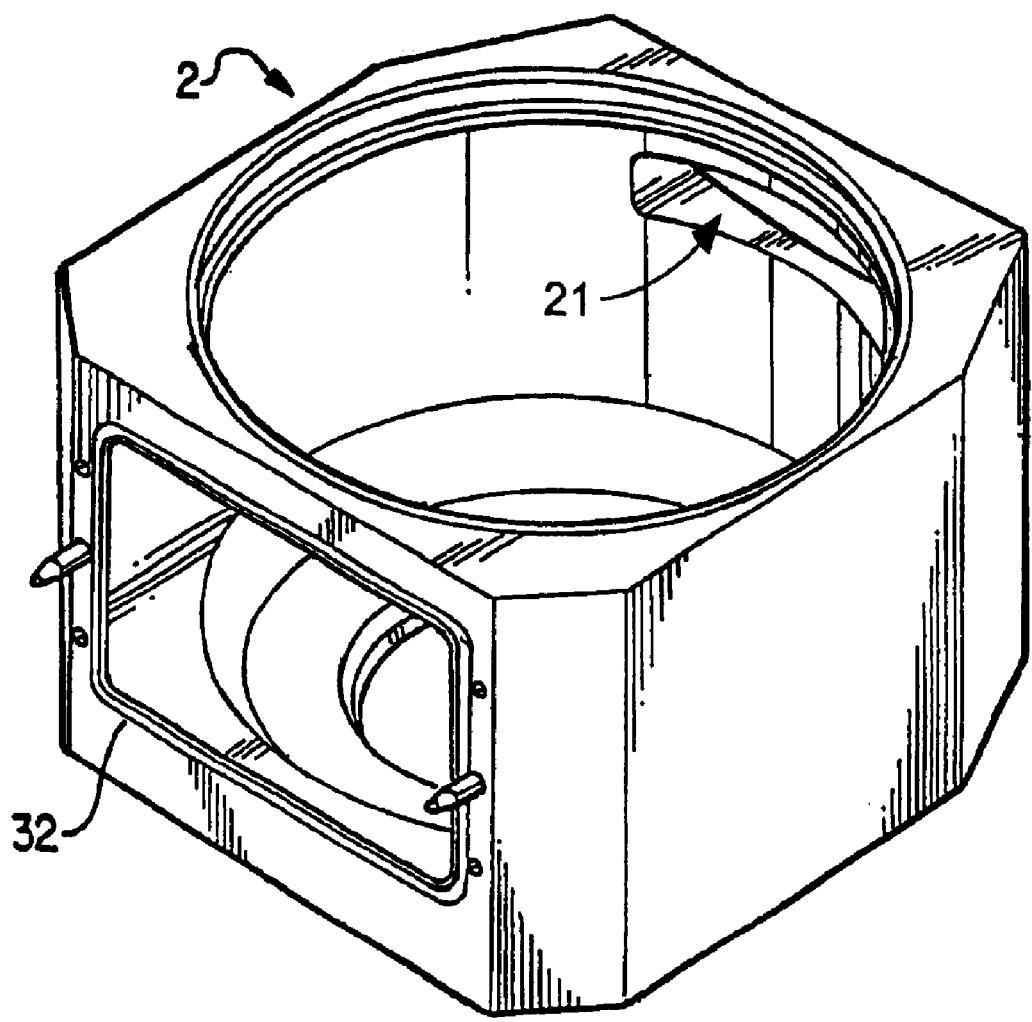
FIG. 2 shows the plasma reaction chamber of FIG. 1 without various components including the tiled liner.

As shown in FIG. 2, the chamber can have a modular design which allows various plasma generating sources to be mounted thereon. Further, the substrate support 8 can be supported at one end of a support arm mounted in a cantilever fashion such that the entire substrate support/support arm assembly can be removed from the chamber by passing the assembly through an opening 32 in the sidewall of the chamber. The chamber can be of any suitable material and according to a preferred embodiment of the invention the chamber is formed out of a single piece of aluminum or an aluminum alloy.

Figure 3:
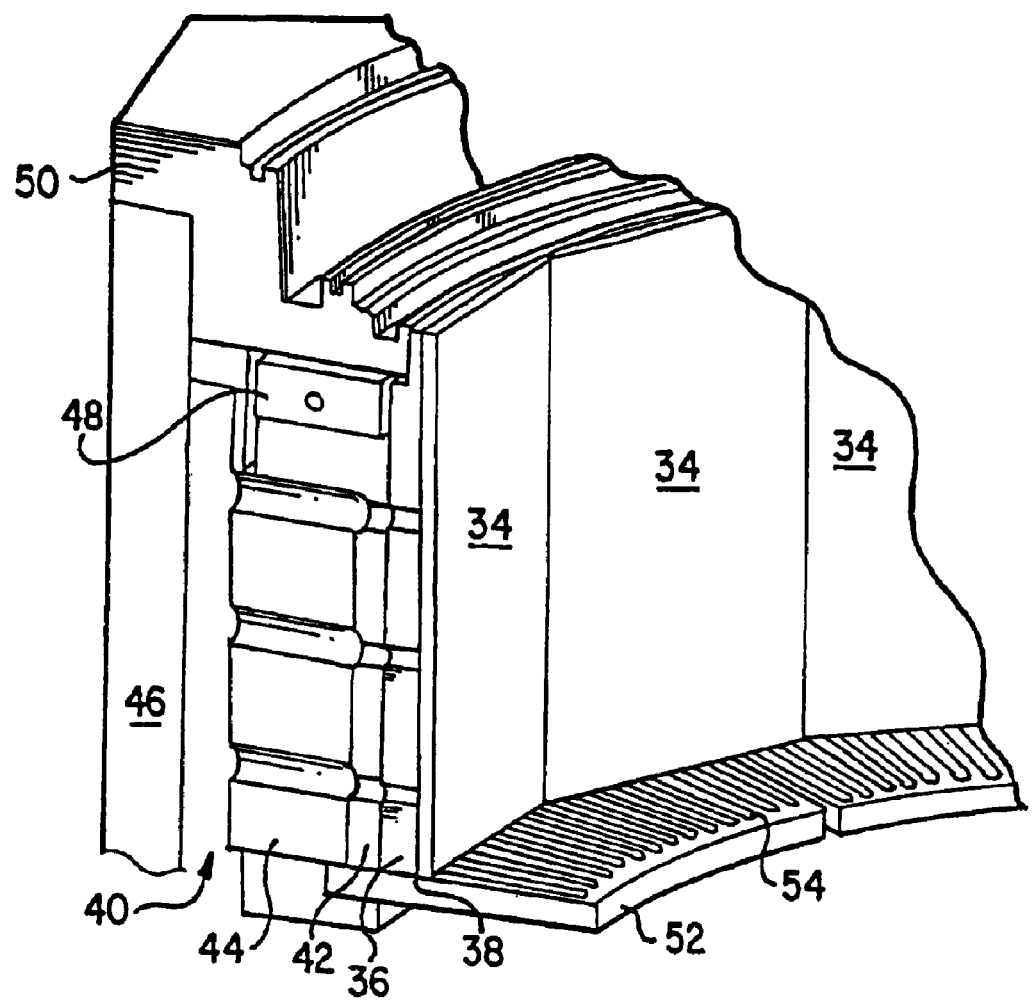
FIG. 3 shows details of a support arrangement for the tiled liner.
Figure 4:
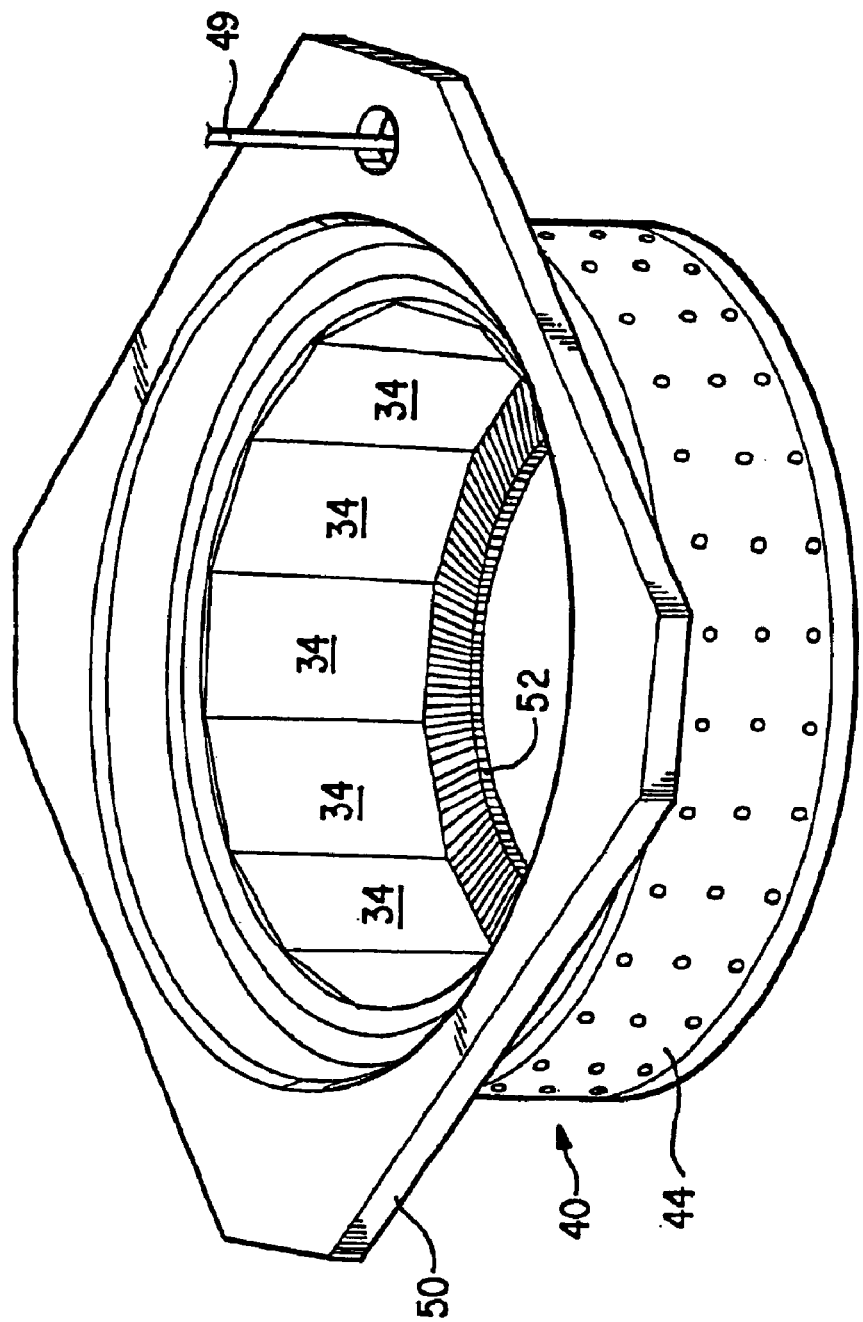
FIG. 4 shows a perspective view of the plasma chamber of FIG. 3.

According to a first embodiment of the invention, the plasma chamber liner 20 comprises interlocking ceramic liner elements such as flat tiles 34, as shown in FIGS. 3 and 4. To provide an electrical ground path for the plasma, the tiles 34 are preferably of an electrically conductive material such as silicon and carbon. For example, the tiles can be entirely of CVD SiC or Si impregnated SiC coated with CVD SiC. Such a material provides an added benefit in that it does not contain aluminum and thus reduces Al contamination of processed substrates. The SiC tiles can be bonded to an aluminum backing plate 36 using an electrically conductive elastomer 38 which can absorb lateral stresses caused by different thermal expansion coefficients of the SiC and Al. Each tile and backing plate assembly can be attached directly or indirectly to the chamber wall. For example, the tiles can be supported by a support frame 40 which includes an inner frame 42 and an outer frame 44. Temperature control of the liner can be achieved by a heater 48 supplied power by electrical leads 49 and a temperature controlled member 50.

The elastomeric joint can comprise any suitable elastomeric material such as a polymer material compatible with a vacuum environment and resistant to thermal degradation at high temperatures such as above 200° C. The elastomer material can optionally include a filler of electrically and/or thermally conductive particles or other shaped filler such as wire mesh, woven or non-woven conductive fabric, etc. Polymeric materials which can be used in plasma environments above 160° C. include polyimide, polyketone, polyetherketone, polyether sulfone, polyethylene terephthalate, fluoroethylene propylene copolymers, cellulose, triacetates, silicone, and rubber. Examples of high purity elastomeric materials include one-component room temperature curing adhesives available from General Electric as RTV 133 and RTV 167, a one-component flowable heat-curable (e.g. over 100° C.) adhesive available from General Electric as TSE 3221, and a two-part addition cure elastomer available from Dow Corning as "SILASTIC." An especially preferred elastomer is a polydimethylsiloxane containing elastomer such as a catalyst cured, e.g. Pt-cured, elastomer available from Rhodia as V217, an elastomer stable at temperatures of 250° C. and higher.

In the case where the elastomer is an electrically conductive elastomer, the electrically conductive filler material can comprise particles of a an electrically conductive metal or metal alloy. A preferred metal for use in the impurity sensitive environment of a plasma reaction chamber is an aluminum alloy such as a 5–20 weight % silicon containing aluminum base alloy. For example, the aluminum alloy can include about 15 wt % silicon. However, filler particles of silicon or silicon carbide can also be used.

A plasma screen 52 extends inwardly from a lower edge of the tiles 34. The plasma screen 52 is preferably of an electrically conductive ceramic material such as Si impregnated SiC coated with CVD SiC and includes openings 54 which are small enough to confine the plasma but allow process gas and processing byproducts to be removed by the vacuum pump.

The heater 48 can comprise an electrical resistance heating, element embedded in an aluminum casting. Thus, by passing electrical current through the heating element, heat will be supplied to the aluminum casting which in turn conducts heat into the inner frame 42, the aluminum backing plates 36, the heat conductive elastomer 38 and into the tiles 34. During heating and cooling of the aluminum body of the heater, the heater will expand to a greater extent than the ceramic liner formed by the tiles 34. In order to accommodate such expansion and contraction, the inner and outer support frames are configured to be elastically bendable. For example, the frames can be segmented such that a series of axially extending lower portions thereof are separated by axially extending slits. In addition, the inner and outer frames can be configured to provide a desired amount of thermal conductance. For instance, the outer frame 44 can be of a metal such as aluminum or an aluminum alloy and a lower portion thereof can have a thickness sufficient to withdraw heat from the liner and a thin upper portion to allow adequate bending of the outer frame due to thermal stresses during processing of a semiconductor substrate.

Figure 5:
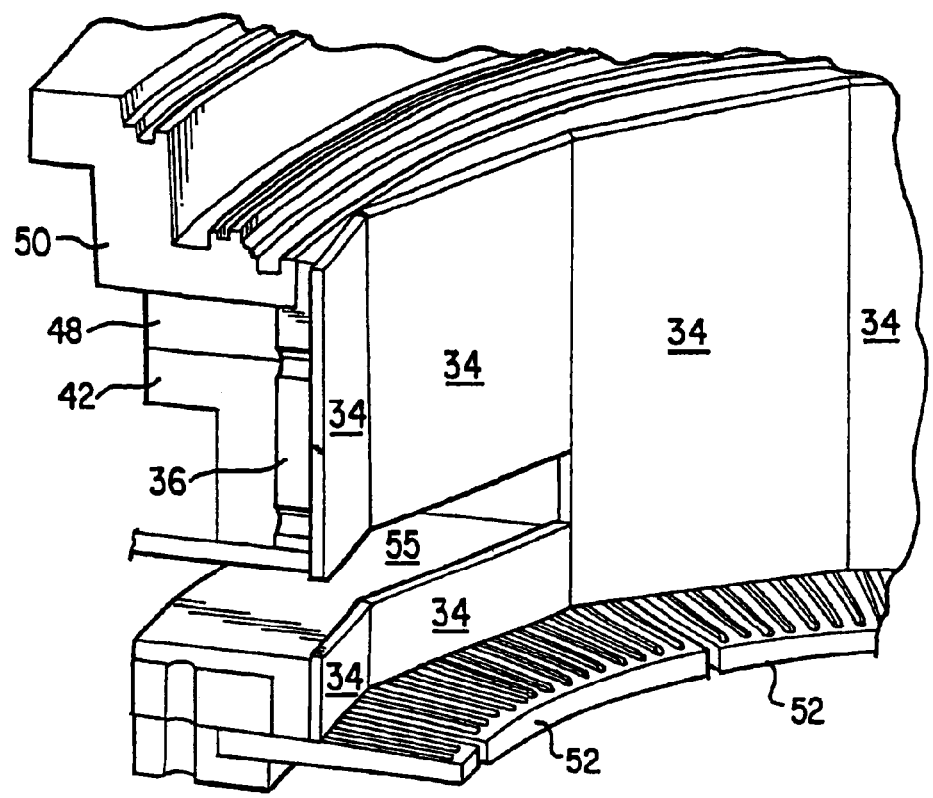
FIG. 5 shows details of a slip cast wafer passage insert in accordance with the invention.

FIG. 5 shows a portion of the chamber wall wherein a substrate such as a wafer can be introduced and removed from the chamber through a transport slot 55 in a wafer passage insert. In the arrangement shown in FIG. 5, some of the tiles 34 are shorter in the axial direction in the vicinity of the slot 55. The slot 55 is preferably formed from an integral piece of Si impregnated SiC coated with CVD SiC.

Figure 6:
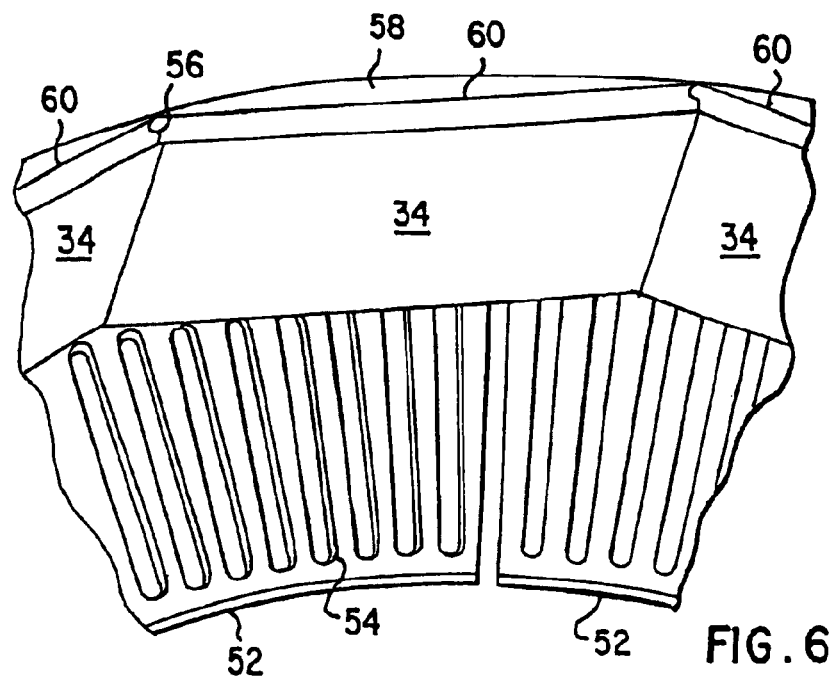
FIG. 6 shows how edges of the tiles of FIG. 3 fit together in an interlocking arrangement.

In order to prevent a line of sight between the wafer 6 and the chamber wall 46, each tile 34 can have edges 56 which interlock with mating edges of adjacent tiles, as shown in FIG. 6. As shown in this alternative embodiment, the chamber 58 can have polygonal inner surfaces 60 wherein the tiles are bonded directly to flat surfaces 60 of the chamber by an electrically and thermally conductive elastomer. Such an arrangement is advantageous in that it has fewer parts than the tile/backing plate arrangement and allows liner removal for cleaning and replacement to be carried out more quickly.

Figure 7:
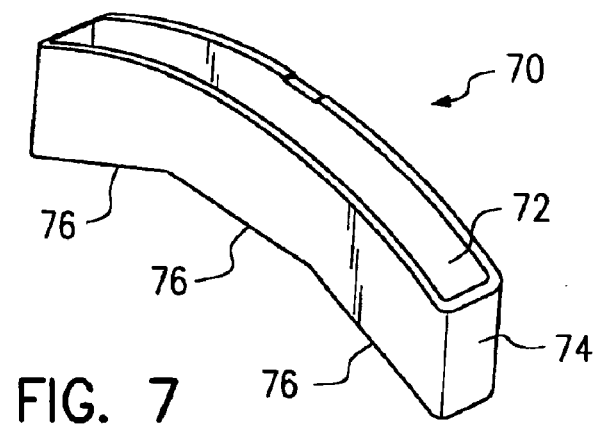
FIG. 7 shows a perspective view of a one piece slip cast wafer passage insert in accordance with the invention.
Figure 8:
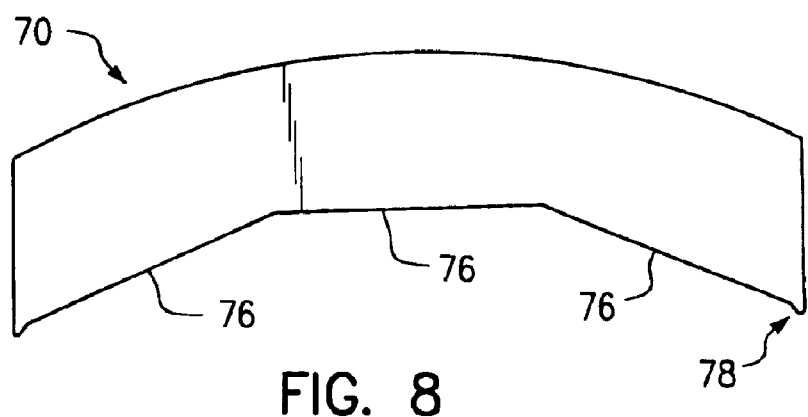
FIG. 8 shows a top view of the insert shown in FIG. 7.
Figure 9:
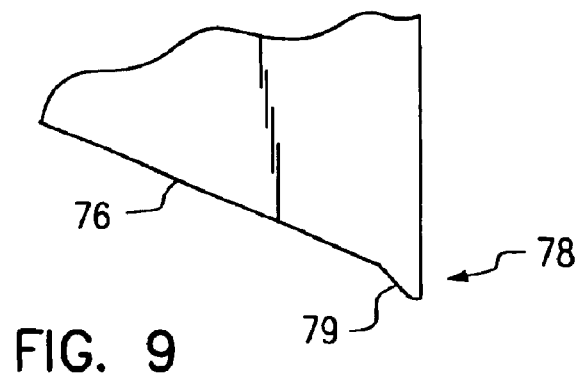
FIG. 9 shows an enlarged view of a corner of the insert shown in FIG. 8.

FIG. 7 shows a perspective view of a slip cast wafer passage insert 70. The insert 70 includes an inner surface 72 forming the wafer transfer slot 55 shown in FIG. 5. The shape of the part shown in FIG. 7 can be slip cast in the manner described above and the inner surface 72 and optionally the entire outer surface 74 can be coated with CVD SiC. The side of the insert facing the interior of the plasma chamber includes rectilinear edges 76 which abut surfaces of the tiles 34 opposite to the side of the tiles facing the interior of the chamber. FIG. 8 shows a top view of the insert 70 and FIG. 9 is an enlarged view of a corner 78 of one of the edges 76, the edge 78 including an angled section 79 having a length corresponding to the wall thickness of insert 70.

In the foregoing embodiments, the plasma in the chamber can be confined by the SiC surfaces of the gas distribution plate, the liner, the plasma screen and the substrate support which extends upwardly through the inner periphery of the plasma screen. Because the CVD coating on the Si impregnated SiC parts are located between the plasma and aluminum surfaces of the chamber, sputtering of the Al surfaces by the plasma is minimized and contaminating processed wafers with Al is reduced compared to chambers having Al surfaces with line-of-sight to the processed wafer.

In the foregoing embodiment, the liner comprises tiles of Si impregnated SiC coated with CVD SiC bonded to an aluminum backing plate by an electrically and/or thermally conductive elastomer bonding material. If desired, the liner can comprise a continuous surface rather than the individual tiles. The chamber wall can be of any desired configuration such as cylindrical, polygonal, etc. A suitable access opening in the wafer passage insert allows passage of individual wafers into and out of the chamber and additional openings can be provided in Si impregnated SiC parts coated with CVD SiC to allow various measurements to be made by conventional accessories such as process monitoring equipment. The tiles can have a flat rectangular surface facing the interior of the chamber. Alternatively, the exposed surface of the tiles can be curved such that the tiles form a cylindrical inner wall of the chamber.

In the embodiment wherein the tile and backing plate assemblies are bolted to an Al inner support frame which extends around the inner wall of the chamber, the thermal stresses generated during start-up, operation and shut-down of the plasma chamber can be accommodated. The number of SiC tiles can be chosen to achieve a desired limit on part and/or bond stresses generated due to thermal forces encountered in the plasma chamber.

In the embodiment wherein a lower flange of the inner support frame is bolted to the lower edge of an Al outer support frame and a flange at the upper edge of the outer support frame is bolted to a top plate located on top of the chamber, the outer support is segmented into vertically extending plates separated by slots which extend from the lower end of the outer support frame to the top flange. In order to provide temperature control of the SiC tiled surface, a heater located above the top flange of the inner support frame can be bolted to the inner frame. With such an arrangement, the heater can generate heat which is thermally conducted from the inner support frame to the backing plate and SiC tile. The heater can comprise a single resistance heater which extends entirely around the inner wall of the chamber. Alternatively, the heater can comprise any suitable heater arrangement which achieves the desired temperature control of the liner, e.g., maintaining the inner surface of the liner at a desired temperature such as in the range of 80 to 160° C. during plasma etching of dielectric materials such as silicon oxide.

The chamber can include a plasma screen surrounding the substrate support. The annular screen can be attached to a carrier ring by any suitable technique. For instance, the screen can be adhesively bonded to the carrier ring by the elastomer bonding material discussed earlier. In addition, the carrier ring can be bolted to a lower flange on the inner frame such that the screen is clamped between the carrier ring and the flange. The screen can be of any suitable material which will withstand a plasma environment for semiconductor production. Silicon carbide is a preferred material for the screen. The screen can comprise a single unitary ring or a plurality of spaced apart ring segments. For instance, the screen can include circumferentially spaced apart segments.

In order to accommodate the wafer passage insert, the inner and outer frames include cut-outs therein and the tiles surrounding wafer transfer the slot are arranged such that smaller tiles are below the slot and larger tiles are above the slot. The wafer passage insert preferably comprises a single piece of slip cast SiC which is impregnated with Si and then coated with CVD SiC. If desired, the insert can be made from an assembly of several pieces of such material.

According to the embodiment of the invention wherein line-of-sight surfaces of aluminum components are avoided by covering the surfaces with the SiC tiles, the edges of the tiles are preferably designed such that they overlap each other. For instance, the tiles can have mating edges wherein a projection on one tile is received in a recess in an adjacent tile. This effect can be obtained by any edge design wherein a rectilinear path is not provided between the opposed surfaces of the tile. Thus, a mating curved or multi-sided edge surface such as a V-shaped, U-shaped, W-shaped, groove-shaped, notch-shaped, offset-shaped, etc. type edge can provide the desired mating tile edge.

The interlocking tile joints eliminate line-of-sight to aluminum components and accommodate differential thermal expansion/contraction of liner components during startup, operation and/or shutdown of the plasma reactor. For instance, heat from the heater and/or plasma ion thermal energy deposited on the tiles is thermally conducted by the inner frame, through the elastomer bond, up the outer frame and into the chamber top plate. Due to water cooling of the top plate via cooling channels, the heat transferred through outer frame is removed from the chamber.

During processing of semiconductor substrates, the tiles can be preheated by the heater before plasma is generated in the chamber. For instance, the tiles can be heated to a desired temperature by the heater and a thermal control system can be used to adjust the heater power to maintain the tiles at the desired temperature. After plasma is generated in the chamber, the control system can automatically reduce the heater power to maintain the desired time temperature. Further, the thermal impedances of the inner and/or outer frames can be adjusted to achieve the desired range of tile operating temperatures and limit the heater maximum temperature.

During processing of semiconductor substrates such as plasma etching of silicon wafers, in order to minimize deposition of polymer from gaseous byproducts produced during the etching process, it is desirable to maintain chamber surfaces exposed to the plasma at temperatures of about 80° C. to about 160° C., preferably 110 to 150° C. In addition, such temperature control of these surfaces provides reduction in processing drift during sequential processing of individual wafers. Prior to striking a plasma in the chamber, a resistance heater can be used to heat the ceramic liner by thermal conduction, i.e., heat from the heater passes through a resilient Al frame to the ceramic liner. In such an arrangement, the heater and part of the Al frame in contact therewith may heat to around 300° C. in order to heat the ceramic liner to around 150° C. The resilient Al frame comprised of the inner and outer frames allows the part of the Al frame in contact with the heater to expand relative to the portion of the Al frame in contact with the ceramic liner and thus accommodate any bending stresses on the intermediate part of the Al frame.

If desired, one or more parts of the chamber can be made of CVD SiC. The CVD SiC can be deposited on a substrate such as graphite and grown to a desired thickness after which the substrate is removed such as by machining. For example, in the case of a cylindrical liner, CVD SiC can be deposited to a desired thickness on a graphite cylinder and the graphite cylinder is later machined away leaving the CVD SiC cylinder liner. Advantages of the CVD SiC include high thermal conductivity (e.g., CVD SiC has about twice as much thermal conductivity as sintered SiC) and tailored electrical resistivity (e.g., resistivity of SiC can be varied from electrically conducting to semiconducting). An advantage of using CVD SiC for the reactor components is that it is possible to obtain a highly uniform temperature distribution across the surface of the component inside the reactor. In the case of processing wherein the component is maintained at a high enough temperature to minimize polymer buildup on the exposed surfaces of the component, the use of CVD SiC is highly advantageous from the standpoint of temperature control and minimizing particle generation.

An example of preparing a slip cast component in accordance with the invention is as follows.

A mixture of 1 part by weight of medium particles of SiC powder with average particle diameters between 10 $\mu$m and 30 $\mu$m and 1–2.5 parts by weight of coarse particles of SiC powder with average particle diameters between 80 $\mu$m and 200 $\mu$m is kneaded and granulated after adding an organic binding agent. Then, the mixture is formed into a shape defined by a plaster mold after which the shaped part is dried. Next, the shaped part is presintered at 800 to 1200° C. followed by reaction sintering at 1500 to 1800° C. while impregnating the shaped part with Si. The sintered part is then placed in a vacuum furnace and coated with SiC using a mixture of trichloromethyl silane gas at 4 ml/min with hydrogen as a carrier gas at 4000 ml/min. As a result, a slip cast SiC part is produced with a CVD SiC coating.

The foregoing has described the principles, preferred embodiments and modes of operation of the present invention. However, the invention should not be construed as being limited to the particular embodiments discussed. Thus, the above-described embodiments should be regarded as illustrative rather than restrictive, and it should be appreciated that variations may be made in those embodiments by workers skilled in the art without departing from the scope of the present invention as defined by the following claims.

What is claimed is:

1. A method of processing semiconductor substrates and reducing particle contamination and/or process drift during consecutive processing of the substrates, the method comprising steps of:
   (a) placing a substrate on a substrate holder in an interior space of a plasma processing chamber, the processing chamber including at least one slip cast part having a surface exposed to the interior space, the slip cast part having free silicon contained therein and a protective layer on the surface which protects the silicon from being attacked by the plasma in the interior space;
   (b) processing the substrate by supplying process gas to the processing chamber and energizing the process gas into a plasma state in the processing chamber, the slip cast part being exposed to the plasma and optionally providing a ground path for RF current sustaining the plasma;
   (c) removing the substrate from the processing chamber; and
   (d) consecutively processing additional substrates in the processing chamber by repeating steps (a–c) while minimizing particle contamination of the substrates and/or reducing process drift during the processing step as a result of protecting the free silicon from attack by the plasma.

2. The method according to claim 1, wherein the slip cast part comprises a liner within a sidewall of the processing chamber, the processing chamber including a substantially planar antenna which energizes the process gas into the plasma state by supplying RF power to the antenna and the process gas comprising one or more hydrofluorocarbon gases.

3. The method according to claim 1, wherein the plasma comprises a high density plasma and the substrates are processed by etching an oxide layer on the substrates with the high density plasma while supplying an RF bias to the substrates.

4. The method according to claim 1, wherein the slip cast part comprises a liner within a sidewall of the processing chamber, a gas distribution plate supplying the process gas to the processing chamber, a perforated baffle extending between the substrate holder and an inner wail of the processing chamber, a wafer passage insert and/or a focus ring surrounding the substrate.

5. The method according to claim 1, wherein the slip cast part comprises a wafer passage insert fitted in an opening in a ceramic liner within a sidewall of the processing chamber, the liner being heated by a heater which maintains the liner at a desired temperature.

6. The method according to claim 1, wherein the slip cast part consists essentially of silicon impregnated slip cast SiC coated with CVD SiC.

7. The method according to claim 1, wherein the slip cast part comprises a heated liner and a baffle, the liner surrounding the substrate holder and the baffle comprising a foraniinous ring extending between the liner and the substrate holder, the liner being heated to a temperature above room temperature during the processing step.

8. The method according to claim 1, wherein the slip cast part comprises a gas distribution plate having a resistivity high enough to allow RF energy to pass therethrough, the process gas being energized by an antenna which couples RF energy into the chamber through the gas distribution plate.

9. The method according to claim 8, wherein the slip cast part further comprises a chamber liner having a resistivity below 200 $\Omega\cdot$cm.

* * * * *